United States Patent [19]

Corda

[11] Patent Number: 4,896,295
[45] Date of Patent: Jan. 23, 1990

[54] EPROM MEMORY CELL WITH TWO SYMMETRICAL HALF-CELLS AND SEPARATE FLOATING GATES

[75] Inventor: Giuseppe Corda, Saronno, Italy

[73] Assignee: SGS-Thomson Microellectronics s.r.l., Milan, Italy

[21] Appl. No.: 167,986

[22] Filed: Mar. 14, 1988

[30] Foreign Application Priority Data

Mar. 12, 1987 [IT] Italy ................................. 19656 A/87

[51] Int. Cl.⁴ ..................... G11C 7/00; G11C 11/40
[52] U.S. Cl. .................................. 365/185; 365/200; 357/23.5
[58] Field of Search ............... 365/174, 182, 185, 200; 357/23.5

[56] References Cited

U.S. PATENT DOCUMENTS

| | | | |
|---|---|---|---|
| 4,355,375 | 10/1982 | Arakawa | 365/174 X |
| 4,639,893 | 1/1987 | Eitan | 365/185 |
| 4,774,202 | 9/1988 | Pan et al. | 365/185 X |
| 4,792,925 | 12/1988 | Corda et al. | 365/185 |

Primary Examiner—Stuart N. Hecker
Assistant Examiner—Alyssa H. Bowler
Attorney, Agent, or Firm—Sixbey, Friedman, Leedom & Ferguson

[57] ABSTRACT

An EPROM memory cell including a source, a drain, a floating gate and a control gate with interposed dielectric oxide is made up of two symmetrical half-cells having the drain and the control gate in common, the sources physically separated but electrically connected with each other and the floating gates separated physically and electrically.

2 Claims, 1 Drawing Sheet

EPROM MEMORY CELL WITH TWO SYMMETRICAL HALF-CELLS AND SEPARATE FLOATING GATES

FIELD OF THE INVENTION

The present invention relates to an EPROM memory cell made up of a pair of symmetrical half-cells with separate floating gates.

BACKGROUND OF THE INVENTION

The usual EPROM memory cells comprise a source, a drain, a floating gate and a control gate, the last two coinciding respectively with a first and second level of polysilicon with interposed dielectric oxide.

Their distribution in a memory matrix can be of the conventional type or of the type described in U.S. Pat. No. 4,792,925 issued Dec. 20, 1988 in the name of this applicant.

Such a 'written', i.e. 'programmed', cell calls for a negative charge on the floating gate which, in the detection phase, maintains the cell in a nonconductive state. A 'virgin', i.e. 'unprogrammed', cell has the floating gate discharged and consequently conducting. Detection of the 'nonconducting' or 'conducting' state, which can be done with an appropriate detection amplifier, then allows determination of whether the cell is programmed or not.

In this connection one of the most common practical problems encountered with EPROM memory cells is represented by the dielectric defects placed between the two levels of polysilicon. A defect in the dielectric tends to bring on progressive reduction of the charge stored in a 'written' cell, resulting in causing the cell to become conducting, i.e. in the state representative of the 'unprogrammed' condition. A 'programmed' cell with defective dielectric appears then and is sensed in the same manner as an 'unprogrammed' cell. This clearly leads to an error in the detection phase.

The object of the present invention is now to make an EPROM memory cell which would be substantially free of detection problems caused by defects in the dielectric.

In accordance with the invention said object is achieved by an EPROM memory cell including a source, a drain, a floating gate and a control gate with dielectric oxide placed between said gates characterized in that it consists of two symmetrical half-cells having the drain and control gates in common, the sources physically separated but electrically connected together, and the floating gates physically and electrically separate.

In this manner any defect in a half-cell of a programmed cell can cause that half-cell to become conducting, but not the other one of the same cell, and a detection amplifier capable of judging a cell conductive only if both the half-cells are conducting can prove insensitive to the defective dielectric and hence give a correct detection.

Since the defects are substantially a statistical fact, it is highly improbably that both the half-cells will be defective. The matrix thus proves to have 100% redundancy without the need of having recourse to particular circuits. This is very useful especially for those devices in which a large EPROM must be combined with various other functions, e.g. with microprocessors, STD cells and so forth. The result is an extremely reliable high-output product.

The present invention can be put in practice with a conventional distribution of cells or of the kind illustrated in the abovementioned Italian patent application no. 23479 A/84 or some other type.

BRIEF DESCRIPTION OF THE DRAWINGS

The solution in accordance with the above Italian patent application will be described below in detail merely as an example with reference to the annexed drawings wherein.

DESCRIPTION OF PREFERRED EMBODIMENTS

Figure 1:
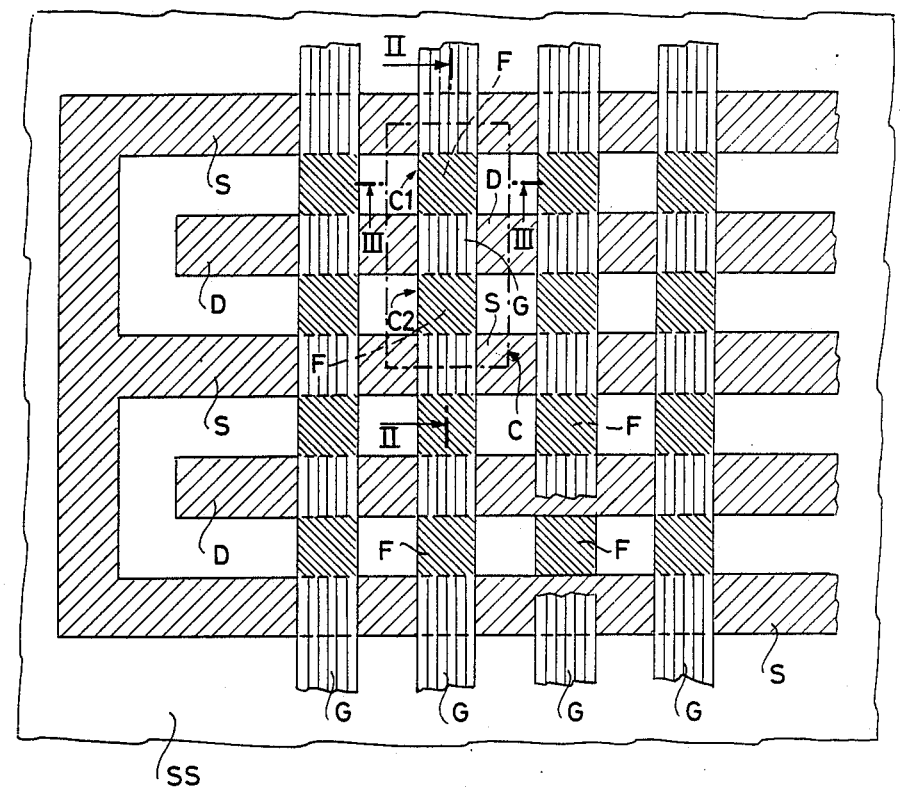
FIG. 1 shows a schematic plan view of a portion of the EPROM memory matrix formed of a plurality of cells in accordance with the present invention.

The EPROM memory matrix shown in FIG. 1 comprises a substrate of monocrystalline silicon SS in which are made by diffusion of $N^+$ dope a plurality of equally spaced parallel source lines separated physically but connected electrically together at one end (on the left in FIG. 1) and a similar plurality of parallel equally spaced drain lines D alternating with said source lines S.

Figure 2:
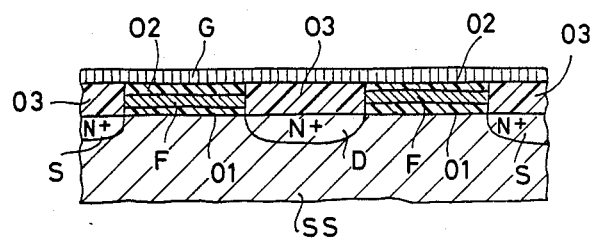
FIG. 2 shows an enlarged cross section of a memory cell of the above matrix along line II—II of FIG. 1.
Figure 3:
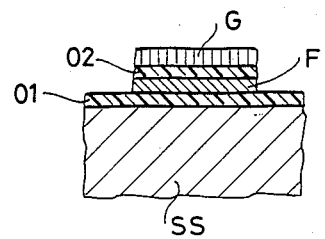
FIG. 3 shows a cross section of said memory cell along line III—III of FIG. 1.

Perpendicularly to the source and drain lines is developed a plurality of equally spaced parallel control gate lines G consisting of strips of polysilicon and under said gate lines G, in the spaces between the source and gate lines S and D, there are provided floating gate areas F, also made with polycrystalline silicon. The floating gate areas F thus constitute a first level of polysilicon while the control gate lines G, which are selfaligned with the areas F, constitute a second polysilicon level (FIGS. 2 and 3).

Thin oxide areas O1 and O2 are placed between the floating gate areas F and the substrate SS and between the control gate lines G and said floating gate areas respectively while thick oxide areas O3 are placed between the control gate line G and source and drain lines S and D. The thin oxide O2 functions as a dielectric between the two polysilicon levels F and G. Said oxide areas are shown in FIGS. 2 and 3 but, for drawing clarity, not in FIG. 1.

The memory matrix of FIG. 1 is formed of a plurality of elementary cells C in accordance with the invention, each of which is formed of two symmetrical half-cells C1 and C2, of the MOS type, which have drains D and control gates G in common, sources S physically separated but electrically connected together and floating gates F physically and electrically separated.

The elementary cell C and, in general, the EPROM memory matrix of FIG. 1 consequently operate in the following manner.

A 'written', i.e. 'programmed', cell has the floating gate F charged negatively following the previous writing operation, performed by applying a positive voltage to the drain line D and the control gate line G corresponding to the selected cell, while a 'virgin', i.e. 'unprogrammed' cell has the floating gate discharged.

In the detection phase, which consists of applying a lower positive voltage to the drain line D (1–3 V) and to the control gate G (3–5 V) corresponding to the selected cell, the floating gate of a written cell preserves its negative charge and hence keeps the cell conducting. The floating gate of a virgin cell allows the cell to conduct. Detection of the conducting or nonconducting state of a cell, which can be done in a known manner with a detection amplifier, is thus indicative of the written or virgin state of said cell.

However, it can happen that a written cell will present defects in the dielectric O2 placed between the two polysilicon levels F and G, in effect a hole in said dielectric. In this case the negative charge of the floating gate progressively falls until the floating gate, now discharged, brings the cell to conduction, i.e. to the virgin cell state.

While in conventional cells this could be a source of erroneous operation, the same thing does not occur in the cells C of the matrix in accordance with the invention, said cells being formed of two symmetrical half-cells C1–C2 with separate floating gates. In this case if one of the half-cells has defective dielectric it is highly improbable that the other half-cell will have the same defect. It is then sufficient to set the detection amplifier to judge the cell conductive, hence virgin, only if both the half-cells are conductive, for correct operation and detection of the state of said cell to be assured, even if one of the two half-cells has a defect in the dielectric. This can be secured by setting the threshold of the detection amplifier so that it corresponds to a cell current equal to half the maximum current conducted by the virgin cell.

It was stated above that, without prejudice for the inventive idea of making the elementary cell in the form of two symmetrical half-cells with separate floating gates, said cell can be included in an EPROM memory matrix of various configurations.

One of such configurations has been illustrated as an example in the drawings and is of the type described in the previous Italian patent application no. 23479 A/84 filed Nov. 7, 1984 by this applicant. Other configurations can also be utilized. For example, it is possible to introduce field oxide between one cell and the next of the matrix of FIG. 1, as the $N^+$ doped rows and those of the control gates can be spaced differently and cells with local doping (Dmos type) can be used; if necessary, even the conventional structure could be used.

The configuration of FIG. 1 is however preferable because, as already made clear in the abovementioned application, it allows greater cell density and hence a more compact structure. Furthermore, compared with the version described in the abovementioned application the one shown in FIG. 1 has the advantage of not displaying writing or detection difficulties, that is quite conventional operating methods and diagrams can be used.

I claim:

1. An EPROM memory cell matrix comprising a silicon substrate; a plurality of parallel drain lines formed on said substrate; a plurality of parallel source lines formed on said substrate and alternating with said drain lines; floating gate areas spanning said drain lines and source lines; a plurality of parallel control gate lines arranged perpendicularly to said drain and source lines and superimposed on and self-aligned with said floating gate areas; and oxide areas electrically separating said drain lines, said source lines, said floating gate areas, and said control gate lines; wherein all of said source lines are electrically connected together so that each cell of said matrix comprises two symmetrical half-cells having a drain and a control gate in common, with respective sources being separated physically but connected electrically and respective floating gates being separated physically and electrically.

2. The memory cell matrix in accordance with claim 1 wherein said source lines, drain lines, and control gate lines are equally spaced from each other.

* * * * *

UNITED STATES PATENT AND TRADEMARK OFFICE
CERTIFICATE OF CORRECTION

PATENT NO.  : 4,896,295
DATED       : January 23, 1990
INVENTOR(S) : Giuseppe Corda It is certified that error appears in the above-identified patent and that said Letters Patent is hereby corrected as shown below:

ON TITLE PAGE:
[73] Assignee:   SGS-THOMSON MICROELECTRONICS s.r.l.

Signed and Sealed this

Thirty-first Day of March, 1992

*Attest:*

HARRY F. MANBECK, JR.

*Attesting Officer*　　　*Commissioner of Patents and Trademarks*